(12) United States Patent
Yang

(10) Patent No.: US 9,543,205 B2
(45) Date of Patent: Jan. 10, 2017

(54) METHOD OF FABRICATING SEMICONDUCTOR DEVICE

(71) Applicant: Samsung Electronics Co., Ltd., Suwon-si, Gyeonggi-do (KR)

(72) Inventor: Seung-Yeol Yang, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/712,170

(22) Filed: May 14, 2015

(65) Prior Publication Data

US 2016/0118299 A1  Apr. 28, 2016

(30) Foreign Application Priority Data

Oct. 22, 2014  (KR) .......................... 10-2014-0143463

(51) Int. Cl.
*H01L 21/78* (2006.01)
*H01L 23/00* (2006.01)
(Continued)

(52) U.S. Cl.
CPC .............. *H01L 21/78* (2013.01); *H01L 21/561* (2013.01); *H01L 23/3128* (2013.01); *H01L 24/81* (2013.01); *H01L 24/97* (2013.01); *H01L 2224/16227* (2013.01); *H01L 2224/32145* (2013.01); *H01L 2224/48091* (2013.01); *H01L 2224/48227* (2013.01); *H01L 2224/73253* (2013.01); *H01L 2224/73265* (2013.01); *H01L 2224/80815* (2013.01); *H01L 2224/97* (2013.01); *H01L 2225/0651* (2013.01); *H01L 2225/06517* (2013.01); *H01L 2225/06558* (2013.01);
(Continued)

(58) Field of Classification Search
CPC ........ H01L 21/78; H01L 21/82; H01L 21/782; H01L 23/28; H01L 23/29; H01L 23/31; H01L 23/3121; H01L 23/3128
See application file for complete search history.

(56) References Cited

U.S. PATENT DOCUMENTS 3,962,184 A * 6/1976 Notomi ................ C08K 5/3445
525/504
6,573,612 B1 * 6/2003 Miyata ................... H01L 21/56
257/678
(Continued)

FOREIGN PATENT DOCUMENTS

JP    2000-183218 A    6/2000
KR    10-2005-0056351 A    6/2005

OTHER PUBLICATIONS

Machine Translation of Sawamoto (JP2000-183218).*

*Primary Examiner* — Zandra Smith
*Assistant Examiner* — Evan Clinton
(74) *Attorney, Agent, or Firm* — Harness, Dickey & Pierce, P.L.C.

(57) ABSTRACT

The method includes disposing semiconductor chips on a package substrate having sawing lines, forming an encapsulant to cover the semiconductor chips on the package substrate, forming a package assembly by a first curing of the encapsulant, forming first grooves by cutting the encapsulant along the sawing lines, performing a second curing of the encapsulant, and dividing the package assembly into unit semiconductor packages by cutting the package substrate along the sawing lines and forming second grooves to overlap the first grooves.

20 Claims, 18 Drawing Sheets

(51) Int. Cl.
*H01L 23/31* (2006.01)
*H01L 21/56* (2006.01)
(52) U.S. Cl.
CPC .............. *H01L 2924/014* (2013.01); *H01L 2924/15159* (2013.01); *H01L 2924/15311* (2013.01); *H01L 2924/1815* (2013.01); *H01L 2924/3511* (2013.01)

(56) References Cited

U.S. PATENT DOCUMENTS

| | | | |
|---|---|---|---|
| 7,605,018 | B2 | 10/2009 | Fan |
| 7,875,805 | B2 | 1/2011 | Lin |
| 2001/0006456 | A1* | 7/2001 | Fujimoto ............ H01L 21/56 361/760 |
| 2006/0099391 | A1* | 5/2006 | Tomioka ............ C08J 5/24 428/209 |
| 2009/0025961 | A1 | 1/2009 | Kanemaru et al. |
| 2013/0075937 | A1* | 3/2013 | Wang ............ H01L 25/0655 257/782 |

* cited by examiner

100g

100h

METHOD OF FABRICATING SEMICONDUCTOR DEVICE

CROSS-REFERENCE TO RELATED APPLICATION

This application claims priority under 35 U.S.C. §119 to Korean Patent Application No. 10-2014-0143463 filed on Oct. 22, 2014, the disclosure of which is hereby incorporated by reference in its entirety.

BACKGROUND

Field

Embodiments of the present disclosure relate to a method of fabricating a semiconductor package.

Description of Related Art

Conventionally, a semiconductor package can form a package assembly covering semiconductor chips on a printed circuit board (PCB) with an encapsulant, and obtain by dividing the package assembly into unit packages by performing sawing process. At this moment, depending on the difference in coefficient of thermal expansion between the PCB and the encapsulant, a warpage may appear in the package assembly due to a heat applied during a process. Recently, as a thickness of the PCB and a thickness of the encapsulant have become smaller, a level of the warpage occurrence has been increased.

SUMMARY

Embodiments of the present disclosure provide methods of fabricating semiconductor packages capable of reducing or minimizing a warpage during a process.

Other embodiments of the present disclosure provide fabricated semiconductor packages using the methods of fabricating the semiconductor packages.

Other embodiments of the present disclosure provide a module including the semiconductor package.

Other embodiments of the present disclosure provide electronic systems including the semiconductor package.

Other embodiments of the present disclosure provide a mobile wireless phone including the semiconductor package.

Various embodiments of the present disclosure are not limited to the above-mentioned embodiments. Other embodiments which are not mentioned may be clearly understood by those of ordinary skill in the art based on the following descriptions.

In accordance with an aspect of the present disclosure, a method of fabricating a semiconductor package may include disposing semiconductor chips on a package substrate having sawing lines, forming an encapsulant to cover the semiconductor chips on the package substrate, forming a package assembly by performing a first curing of the encapsulant, forming first grooves by cutting the encapsulant along the sawing lines, performing a second curing of the encapsulant, and dividing the package assembly into unit semiconductor packages by cutting the package substrate along the sawing lines and forming second grooves to overlap the first grooves.

In accordance with another aspect of the present disclosure, a method of fabricating a semiconductor package may include disposing semiconductor chips on a package substrate having sawing lines, forming an encapsulant to cover the semiconductor chips on the package substrate, forming a package assembly by performing a first curing of the encapsulant, forming first grooves by cutting the package substrate along the sawing lines, performing a second curing of the encapsulant, and dividing the package assembly into unit semiconductor packages by cutting the encapsulant along the sawing lines and forming second grooves to overlap the first grooves.

In accordance with still another aspect of the present disclosure, a method of fabricating a semiconductor package may include disposing semiconductor chips on a package substrate, forming an encapsulant to cover the semiconductor chips on the package substrate, forming a package assembly by performing a first curing of the encapsulant, cutting a half of the package assembly, performing a second curing of the encapsulant, and dividing the package assembly into unit semiconductor packages.

Detailed items of the other embodiments of the present disclosure are included in the detailed descriptions and the accompanying drawings.

BRIEF DESCRIPTION OF THE DRAWINGS

The foregoing and other features and advantages of the present disclosure will be apparent from the more particular description of preferred embodiments of the present disclosure, as illustrated in the accompanying drawings in which like reference characters refer to the same parts throughout the different views. The drawings are not necessarily to scale, emphasis instead being placed upon illustrating the principles of the present disclosure. In the drawings.

DETAILED DESCRIPTION OF THE EMBODIMENTS

Figure 1A:
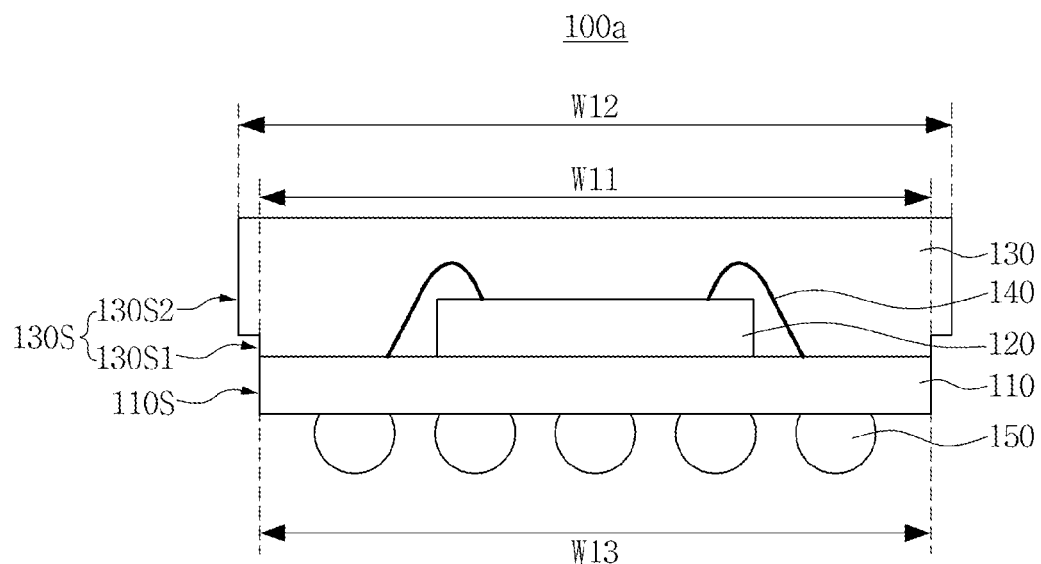
FIGS. 1A to 1H are cross-sectional views schematically illustrating semiconductor packages according to embodiments of the present disclosure.

Advantages and features of the present disclosure and methods of achieving them will be made apparent with reference to the accompanying figures and the embodiments to be described below in detail. However, the present disclosure should not be limited to the embodiments set forth herein and may be construed as various embodiments in different forms. Rather, these embodiments are provided so that disclosure of the present disclosure is thorough and complete, and fully conveys the present disclosure to those of ordinary skill in the art. The present disclosure is defined by the appended claims.

The terminology used herein is only intended to describe embodiments of the present disclosure and not intended to limit the scope of the present disclosure. As used herein, the singular forms "a," "an," and "the" are intended to include the plural forms as well, unless specifically indicated otherwise. The terms "comprises" and/or "comprising" that are used herein specify the presence of mentioned elements, steps, operations, and/or devices, but do not preclude the presence or addition of one or more of other elements, steps, operations, and/or devices.

When one element (elements) is (are) "connected" or "coupled" to other element(s), this may indicate that the one element (elements) is directly connected or coupled to the other elements(s), or intervening elements may be present. On the other hand, when one element referred to as "directly connected (directly connected to)" or "directly coupled (directly coupled to)" other element(s), there are no intervening element(s). Throughout the entire specification, the same reference numerals refer to the same components. The term "and/or" includes each and all combinations of one or more of the items mentioned.

Spatially relative terms, such as "below," "beneath," "lower," "above," "upper," and the like, may be used herein to easily describe the correlation between one device or elements and another device or other elements as illustrated in the figures. The spatially relative terms should be understood as terms that include different orientations of the device in additional usage or operation of the orientations illustrated in figures. For example, when the device illustrated in the figures is turned over, the device described as disposed "below" or "beneath" another device may be disposed "above" the other device. Accordingly, the example term "below" or "beneath" may include both orientations of below and above. The device may be oriented at other orientations, and the spatially relative terms used herein may be interpreted accordingly.

Further, embodiments are described herein with reference to cross-sectional views and/or plan views that are idealized schematic views of the present disclosure. The thicknesses of layers and parts in the figures are overstated for the effective description of technical content. Thus, shapes of the schematic views may vary according to manufacturing techniques and/or tolerances. Therefore, the embodiments of the present disclosure are not limited to the particular shapes illustrated herein but are to include deviations in shapes formed in accordance with the manufacturing process. For example, an etched region illustrated as a rectangular shape may be a rounded shape or a shape of a certain curvature. Thus, the regions illustrated in the figures are schematic in nature, and the shapes of the regions illustrated in the figures are intended to illustrate particular shapes of regions of devices and not intended to limit the scope of the present disclosure.

Like numbers refer to like elements throughout the entire text herein. Thus, the same or similar numbers may be described with reference to other figures even if those numbers are neither mentioned nor described in the corresponding figures. Further, elements that are not denoted by reference numbers may be described with reference to other figures.

FIGS. 1A to 1H are cross-sectional views schematically illustrating semiconductor packages according to embodiments of the present disclosure.

Referring to FIG. 1A, a semiconductor package 100a according to an embodiment of the present disclosure may include a package substrate 110, a semiconductor chip 120, and an encapsulant 130. The semiconductor package 100a may further include external connection terminals 150 disposed under a lower surface of the package substrate 110.

The package substrate 110 may include a rigid printed circuit board (PCB), a flexible PCB, or a rigid-flexible PCB. The package substrate 110 may include a single-layer PCB and a multi-layer PCB. The package substrate 110 may include a plurality of internal interconnections (not shown). The internal interconnections are omitted from the accompanying drawing in order to avoid drawing complexity.

The semiconductor chip 120 may include a memory chip. The semiconductor chip 120 may be electrically connected to the internal interconnections (not shown) of the package substrate 110 through wires 140. The wires 140 may include copper (Cu), gold (Au), or aluminum (Al).

The encapsulant 130 may be formed to cover an upper surface and side surfaces of the semiconductor chip 120 on the package substrate 110. The encapsulant 130 may cover the wires 140. The encapsulant 130 may include an epoxy molding compound (EMC).

Side surfaces 130S of the encapsulant 130 may include first side surfaces 130S1, which are vertically aligned to be coplanar with side surfaces 110S of the package substrate 110, and second side surfaces 130S2, which are not vertically aligned with the side surfaces 110S of the package substrate 110. For example, the first side surfaces 130S1 of the encapsulant 130 may be lower side surfaces of the encapsulant 130 adjacent to the package substrate 110. Further, the second side surfaces 130S2 of the encapsulant 130 may be upper side surfaces of the encapsulant 130 far from the package substrate 110. The side surfaces 110S of the package substrate 110 may be flat.

A lower width W11 of the encapsulant 130 having the first side surfaces 130S1 may be substantially the same as a width W13 of the package substrate 110. Further, an upper width W12 of the encapsulant 130 having the second side surfaces 130S2 may be greater than the width W13 of the package substrate 110. The upper width W12 of the encapsulant 130 may be greater than the lower width W11 of the encapsulant 130. Accordingly, the side surfaces 130S of the encapsulant 130 may have step differences.

Each of the external connection terminals 150 may include one of a solder ball, a solder pad, a solder land, a metal bump, or a pillar. In the embodiment of the present disclosure, the external connection terminals 150 are illustrated when solder balls are used thereto. The external connection terminals 150 may be electrically connected to the internal interconnections (not shown) of the package substrate 110.

The semiconductor package according to the embodiment of the present disclosure has been described above. In the semiconductor package 100a according to the embodiment of the present disclosure as described above, the side surfaces 130S of the encapsulant 130 may have the step differences. Further, among the side surfaces 130S of the encapsulant 130, the lower side surfaces 13051 close to an upper surface of the package substrate 110 may be vertically aligned with the side surfaces 110S of the package substrate 110, and the upper side surfaces 13052 far from the upper surface of the package substrate 110 may not be vertically aligned with the side surfaces 110S of the package substrate 110.

Figure 1B:
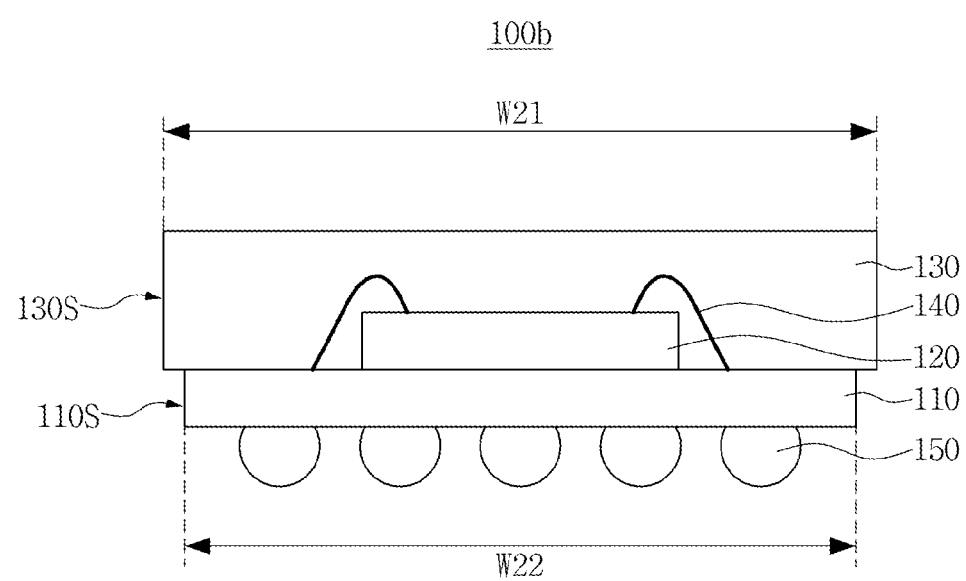

Referring to FIG. 1B, a semiconductor package 100b according to an embodiment of the present disclosure is compared to the semiconductor package in FIG. 1A. Side surfaces 130S of an encapsulant 130 may be flat. The side surfaces 130S of the encapsulant 130 and side surfaces 110S of the package substrate 110 may have step differences without being vertically aligned to each other. For example, a width W21 of the encapsulant 130 may be greater than a width W22 of the package substrate 110.

Figure 1C:
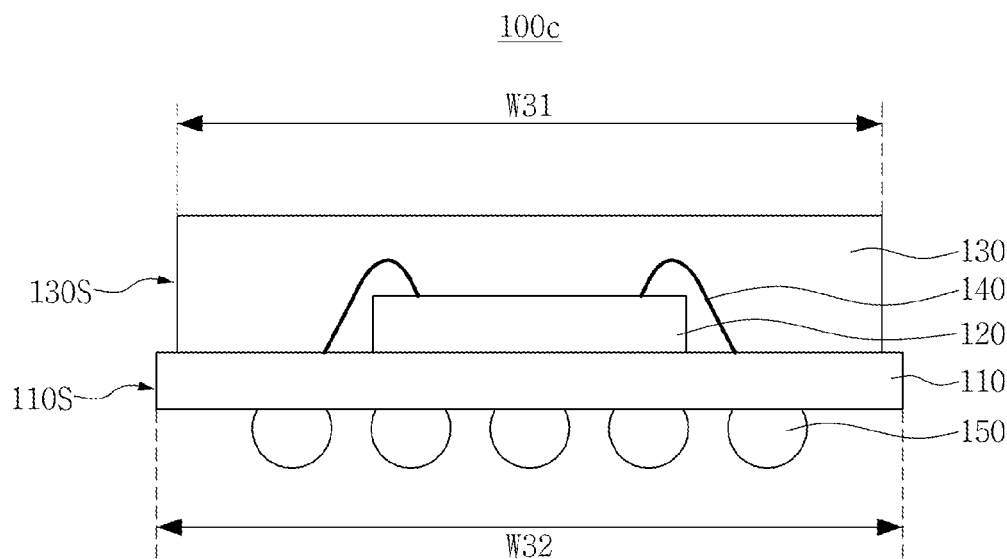

Referring to FIG. 1C, a semiconductor package 100c according to an embodiment of the present disclosure is compared to the semiconductor package in FIG. 1A. Side surfaces 130S of an encapsulant 130 may be flat. The side surfaces 130S of the encapsulant 130 and side surfaces 110S of a package substrate 110 may have step differences without being vertically aligned to each other. For example, a width W31 of the encapsulant 130 may be smaller than a width W32 of the package substrate 110.

Figure 1D:
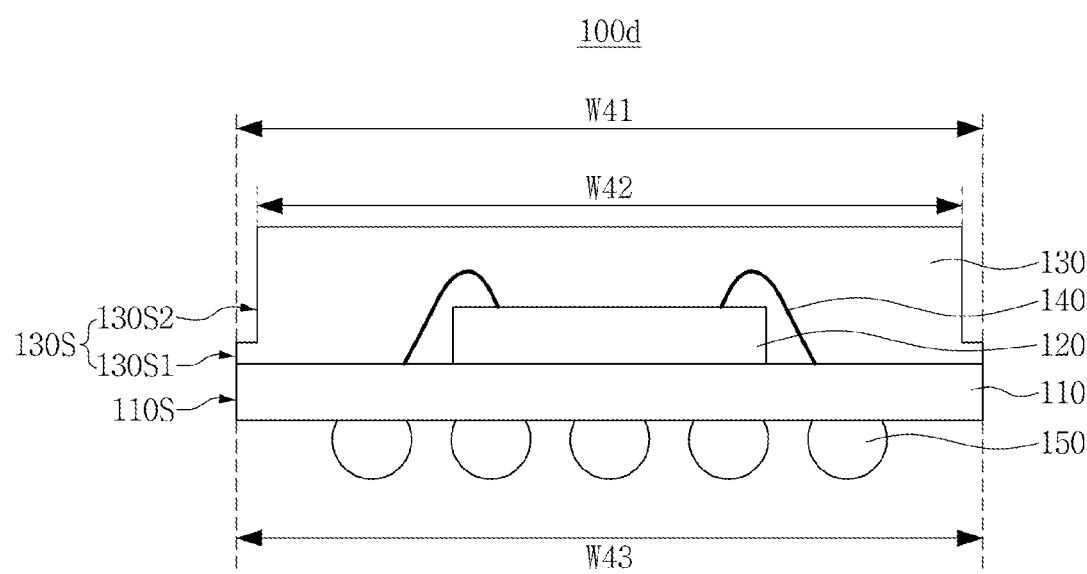

Referring to FIG. 1D, a semiconductor package 100d according to an embodiment of the present disclosure is compared to the semiconductor package in FIG. 1A. Side surfaces 130S of an encapsulant 130 may include first side surfaces 130S1, which are vertically aligned to be coplanar with side surfaces 110S of a package substrate 110, and second side surfaces 130S2, which are not vertically aligned with the side surfaces 110S of the package substrate 110. For example, the first side surfaces 130S1 of the encapsulant 130 may be lower side surfaces of the encapsulant 130 adjacent to the package substrate 110. Further, the second side surfaces 130S2 of the encapsulant 130 may be upper side surfaces of the encapsulant 130 far from the package substrate 110.

A lower width W41 of the encapsulant 130 having the first side surfaces 130S1 may be substantially the same as a width W43 of the package substrate 110. Further, an upper width W42 of the encapsulant 130 having the second side surfaces 130S2 may be smaller than the width W43 of the package substrate 110. The upper width W42 of the encapsulant 130 may be smaller than the lower width W41 of the encapsulant 130. Accordingly, the side surfaces 130S of the encapsulant 130 may have step differences.

Figure 1E:
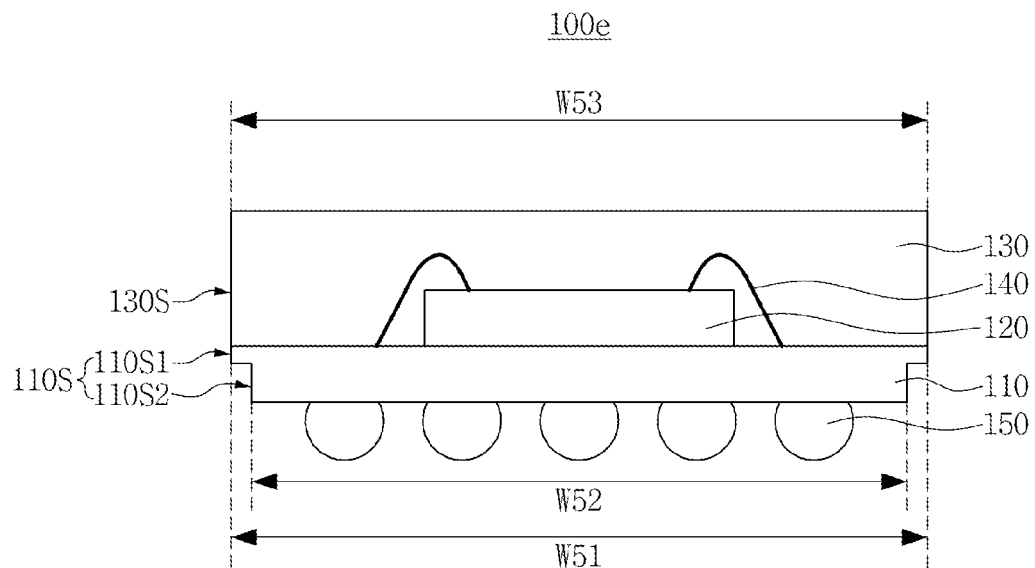

Referring to FIG. 1E, a semiconductor package 100e according to an embodiment of the present disclosure is compared to the semiconductor package in FIG. 1A. Side surfaces 130S of an encapsulant 130 may be flat, and side surfaces 110S of a package substrate 110 may have step differences. For example, the side surfaces 110S of the package substrate 110 may include first side surfaces 110S1, which are vertically aligned to be coplanar with the side surfaces 130S of the encapsulant 130, and second side surfaces 110S2, which are not vertically aligned with the side surfaces 130S of the encapsulant 130. Here, the first side surfaces 110S1 of the package substrate 110 may be upper side surfaces of the package substrate 110 adjacent to the encapsulant 130. Further, the second side surfaces 110S2 of the package substrate 110 may be lower side surfaces of the package substrate 110 far from the encapsulant 130.

An upper width W51 of the package substrate 110 having the first side surfaces 110S1 may be substantially the same as a width W53 of the encapsulant 130. Further, a lower width W52 of the package substrate 110 having the second side surfaces 110S2 may be smaller than the width W53 of the encapsulant 130. The upper width W51 of the package substrate 110 may be greater than the lower width W52. Accordingly, the side surfaces 110S of the package substrate 110 may have step differences.

Figure 1F:
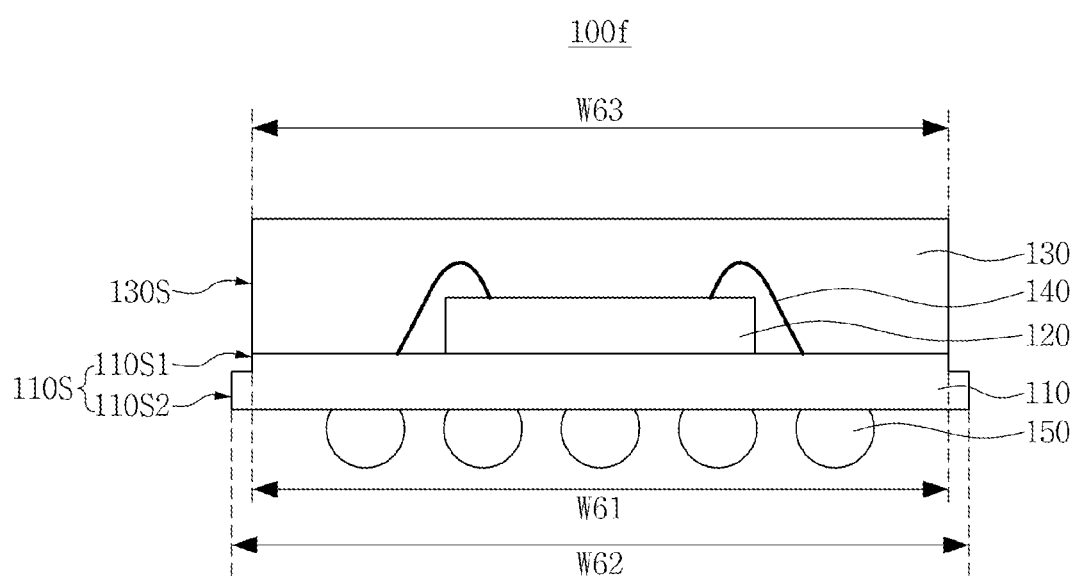

Referring to FIG. 1F, a semiconductor package 100f according to an embodiment of the present disclosure is compared to a semiconductor package in FIG. 1E. An upper width W61 of a package substrate 110 having first side surfaces 110S1 may be substantially the same as a width W63 of an encapsulant 130. Further, a lower width W62 of the package substrate 110 having second side surfaces 110S2 may be greater than the width W63 of the encapsulant 130. The upper width W61 of the package substrate 110 may be smaller than the lower width W62.

Figure 1G:
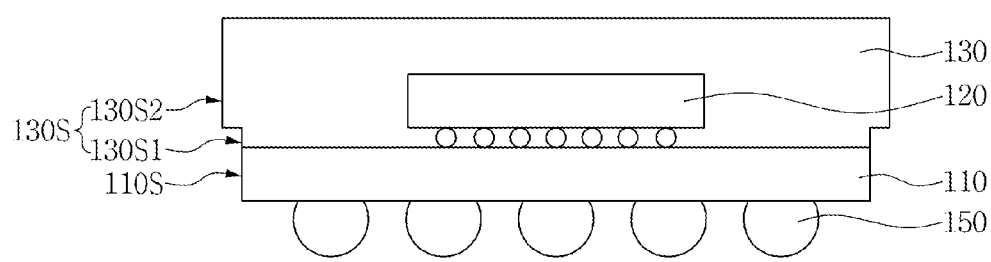

Referring to FIG. 1G, a semiconductor package 100g according to an embodiment of the present disclosure is compared to the semiconductor package in FIG. 1A. A semiconductor chip 120 may be bonded to a package substrate 110 through flip chip bonding. Relationships between the package substrates 110 and the encapsulants 130 included in the present disclosure illustrated in FIGS. 1A to 1F may be compatible with the present disclosure of the semiconductor package 100g having the semiconductor chip 120 bonded through flip chip bonding in FIG. 1G.

Figure 1H:
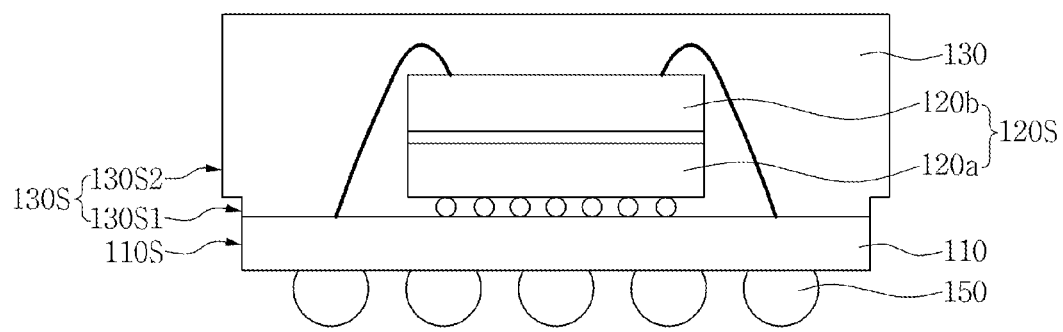

Referring to FIG. 1H, a semiconductor package 100h according to an embodiment of the present disclosure is compared to the semiconductor package in FIG. 1A. A chip-stack 120S may be disposed on a package substrate 110. The chip-stack 120S may include a first semiconductor chip 120a disposed an upper surface of the package substrate 110 and a second semiconductor chip 120b disposed on the first semiconductor chip 120a. For example, the first semiconductor chip 120a may be bonded to the package substrate 110 through flip chip bonding, and the second semiconductor chip 120b may be bonded to the package substrate 110 through wire bonding. Relationships between the package substrates 110 and the encapsulants 130 included in the present disclosure illustrated in FIGS. 1A to 1F may be compatible with the present disclosure of the semiconductor package 100h having the chip-stack 120S in FIG. 1H.

FIGS. 2 to 7 are views illustrating a method of fabricating a semiconductor package according to an embodiment of the present disclosure.

Figure 2:
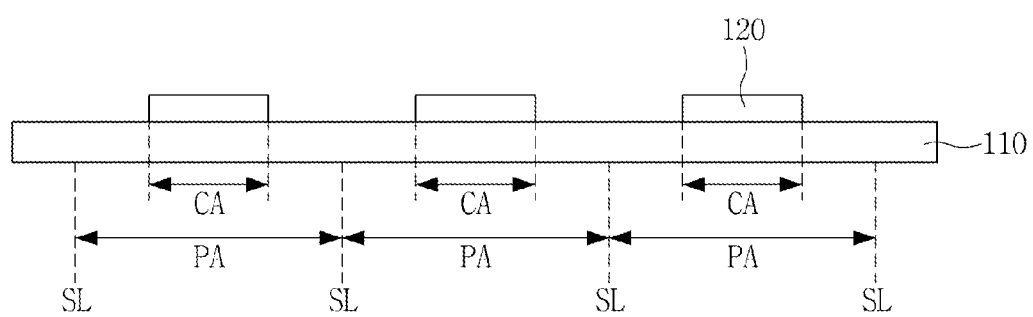
FIGS. 2 to 25 are views describing methods of fabricating semiconductor packages according to embodiments of the present disclosure.

Referring to FIG. 2, a method of fabricating a semiconductor package according to the embodiment of the present disclosure may include disposing a plurality of semiconductor chips 120 on a package substrate 110 having a shape of an undivided plate. The package substrate 110 may include a plurality of package areas PA defined by sawing lines SL. Further, the plurality of package areas PA may include chip areas CA in which each of the semiconductor chips 120 is disposed. The plurality of semiconductor chips 120 may be disposed on the chip areas CA of the package substrate 110, respectively. The package substrate 110 may include a plurality of internal interconnections (not shown). The internal interconnections are omitted from the accompanying drawing to avoid drawing complexity.

Figure 3:
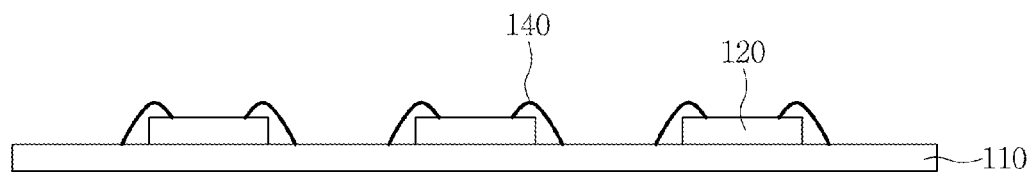

Referring to FIG. 3, the method may include bonding the semiconductor chips 120 on the package substrate 110 using wires 140.

Figure 4:
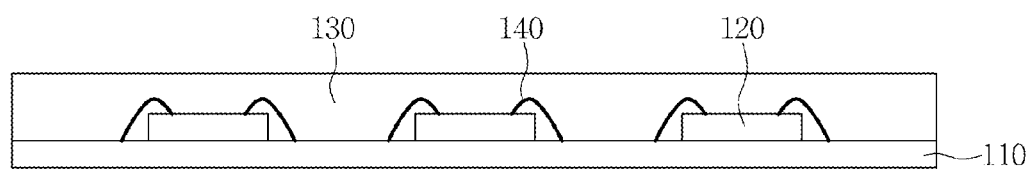

Referring to FIG. 4, the method may include forming an encapsulant 130 in an uncured state (i.e., an a-stage) to cover upper and side surfaces of the semiconductor chips 120 and the wires 140 on the package substrate 110, and may include performing a first curing of the formed encapsulant 130. According to the embodiment of the present disclosure as described above, a structure formed with the encapsulant 130 covering the plurality of semiconductor chips 120 disposed on the package substrate 110 is referred to as a package assembly. That is, in the embodiment of the present disclosure, the package assembly is a structure in which each of the semiconductor chips 120 is disposed in each of the package areas PA of the package substrate 110 having a plurality of package areas PA, and has the structure having one encapsulant 130 formed to cover the plurality of semiconductor chips 120. The package assembly may indicate a state in which package areas PA are not individually divided yet.

The encapsulant 130 may include an EMC. The first curing may be performed at a temperature of 160° C. to 180° C. for 60 seconds. After the first curing, the encapsulant 130 may be semi-cured state (i.e., a b-stage).

Figure 5:
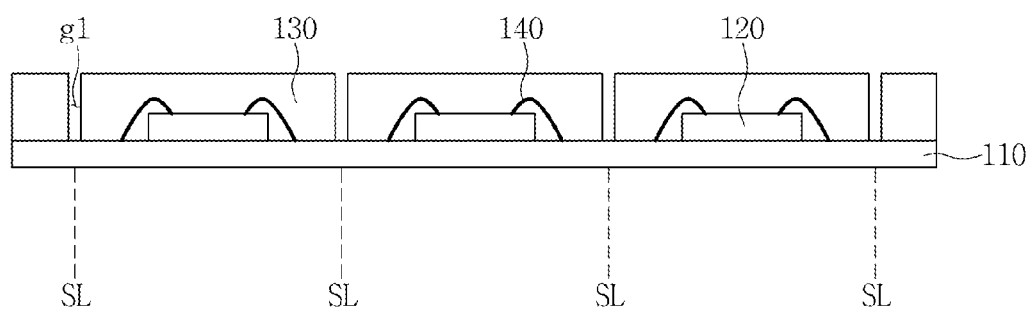

Referring to FIG. 5, the method may include cutting a half of the package assembly, and may include performing a second curing of the encapsulant 130. Specifically, the method may include forming first grooves g1 by cutting the encapsulant 130 along the sawing lines SL, and may include performing a second curing of the encapsulant 130 having the first grooves g1 formed at a temperature of 170° C. to 180° C. for 2 hours. After the second curing, the encapsulant 130 may be fully cured state (i.e., a c-stage).

Here, the cutting of the encapsulant 130 may be performed using a laser. A depth of each of the first grooves g1 and a thickness of the encapsulant 130 may be substantially the same. Accordingly, an upper surface of the package substrate 110 may be exposed in the first grooves g1.

Figure 6:
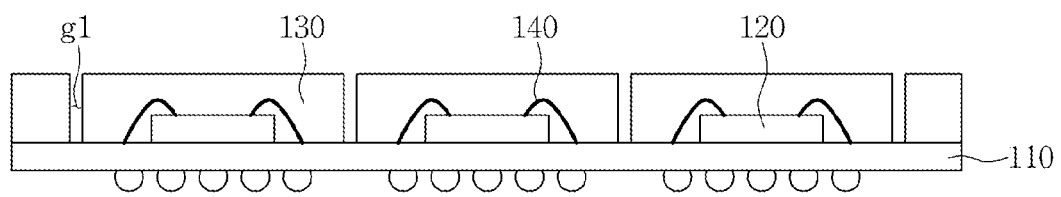

Referring to FIG. 6, the method may include forming external connection terminals 150 under a lower surface of the package substrate 110. For example, the external connection terminals 150 may include solder balls. The forming of the external connection terminals 150 under a lower surface of the package substrate 110 may include flipping the package assembly to have the lower surface of the package substrate 110 facing upward, mounting solder balls on the lower surface of the package substrate 110, and attaching the mounted solder balls to the lower surface of the package substrate 110 through a reflow process.

Figure 7:
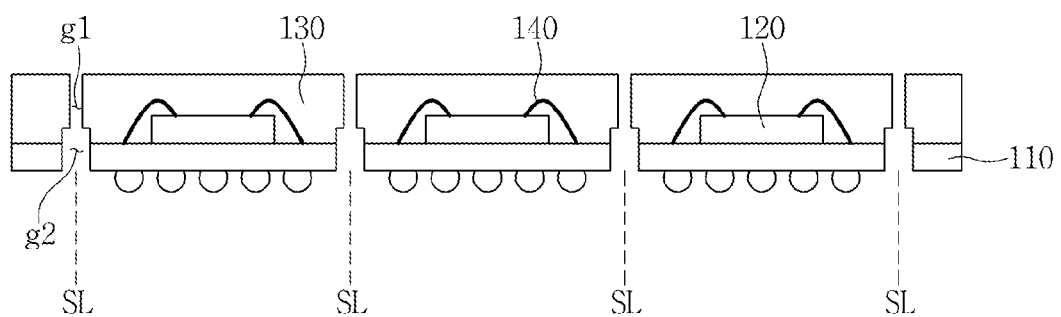

Referring to FIG. 7, the method may include dividing the package assembly into unit semiconductor packages. Specifically, the method may include cutting the package substrate 110 along the sawing lines SL and forming second grooves g2 to overlap the first grooves g1.

Here, the cutting of the package substrate 110 may be performed using a blade. Widths of the second grooves g2 may be different from widths of the first grooves g1. For example, the widths of the second grooves g2 may be greater than the widths of the first grooves g1. A depth of each of the second grooves g2 may be greater than a thickness of the package substrate 110. Accordingly, bottom surfaces of the second grooves g2 may be located in the encapsulant 130. The unit semiconductor packages separated by performing the above-described process may have the same structure as a semiconductor package 100a illustrated in FIG. 1A.

The method of fabricating the semiconductor package according to the embodiment of the present disclosure has been described above. As described above, the method of fabricating the semiconductor package according to the embodiment of the present disclosure may include cutting a semi-cured encapsulant along sawing lines and disconnecting connections among semiconductor chips followed by performing a second curing of the semi-cured encapsulant in order to obtain a package assembly with a reduced or minimized warpage. Further, a warpage of each of the final separated unit semiconductor packages may be further reduced by reducing or minimizing a warpage of the package assembly.

Figure 8:
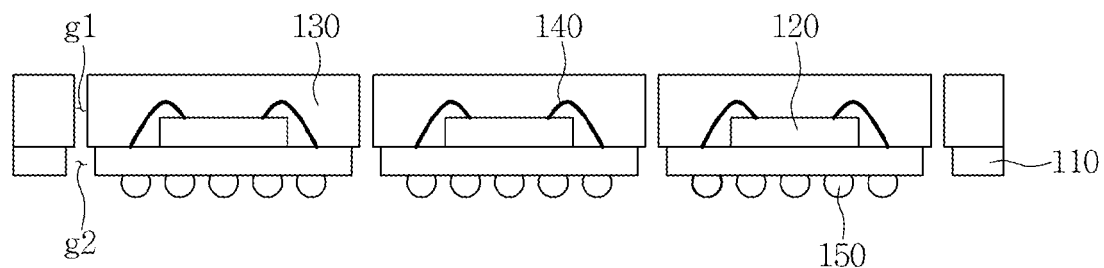

Meanwhile, referring to FIG. 8, a depth of each of the second grooves g2 may be substantially the same as a thickness of a package substrate 110 when compared to FIG. 7. Further, widths of the second grooves g2 may be greater than widths of the first grooves g1. Accordingly, a lower surface of the encapsulant 130 may be exposed in the second grooves g2. Unit semiconductor packages separated by performing the above-described process may have the same structure as a semiconductor package 100b illustrated in FIG. 1B.

Figure 9:
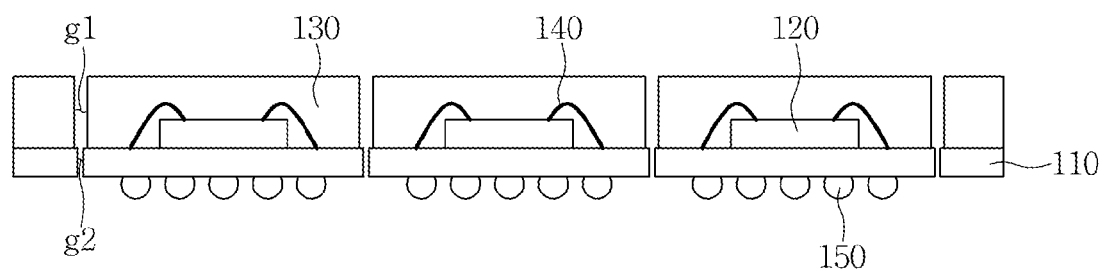

Meanwhile, referring to FIG. 9, widths of the second grooves g2 may be smaller than widths of the first grooves g1 when compared to FIG. 7. Unit semiconductor packages separated by performing the above-described process may have the same structure as a semiconductor package 100c illustrated in FIG. 1C.

Figure 10:
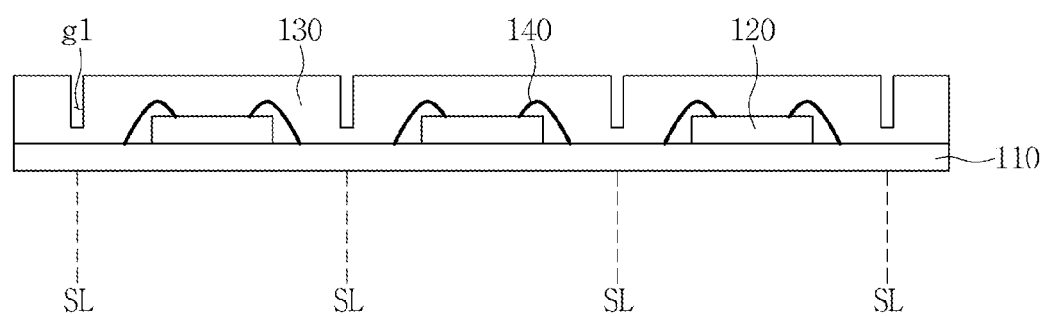
Figure 11:
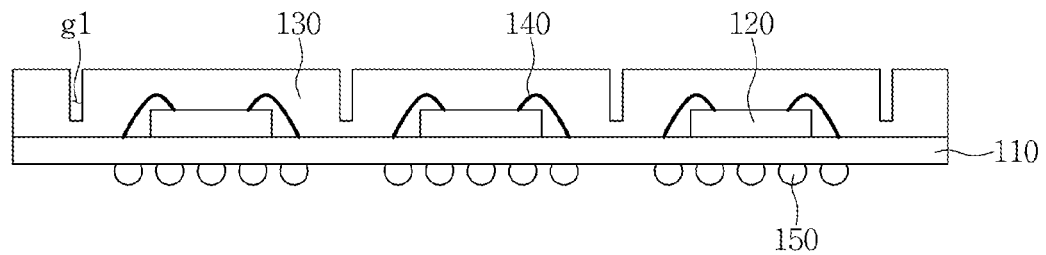
Figure 12:
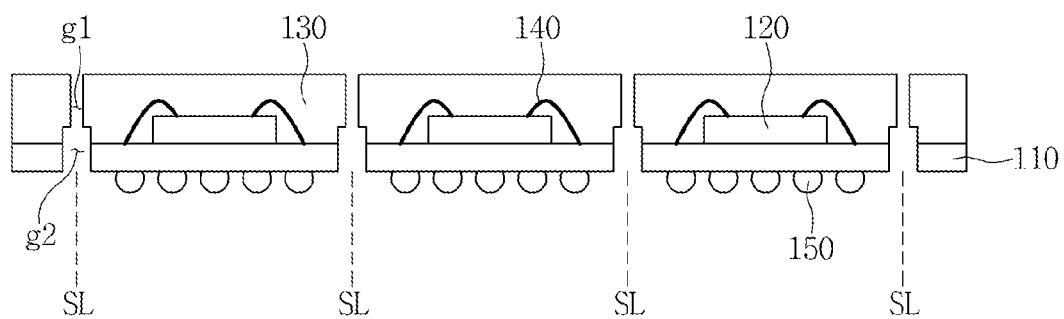

FIGS. 10 to 12 are views illustrating a method of fabricating a semiconductor package according to an embodiment of the present disclosure.

First, referring to FIGS. 2 to 4, the method of fabricating the semiconductor package according to the embodiment of the present disclosure may include disposing the plurality of semiconductor chips 120 on the package substrate 110, bonding the semiconductor chips 120 to the package substrate 110 using wires 140, forming the encapsulant 130 to cover the upper and side surfaces of the semiconductor chips 120 and the wires 140 on the package substrate 110, and forming the package assembly by performing the first curing of the encapsulant 130.

Referring to FIG. 10, the method may include cutting a half of the package assembly. Specifically, the method may include forming first grooves g1 by cutting a part of the encapsulant 130 along sawing lines SL. A depth of each of the first grooves g1 may be smaller than a thickness of the encapsulant 130. Accordingly, bottom surfaces of the first grooves g1 may be located in the encapsulant 130. Further, the method may further include performing a second curing of the encapsulant 130 in which the first grooves g1 are formed.

Referring to FIG. 11, the method may include forming external connection terminals 150 under a lower surface of the package substrate 110. Since the formation of the external connection terminals 150 under the lower surface of the package substrate 110 has been described above, further descriptions will be omitted here.

Referring to FIG. 12, the method may include dividing the package assembly into unit semiconductor packages. Specifically, the method may include forming second grooves g2 to overlap the first grooves g1 by cutting the package substrate 110 along the sawing lines SL. At this moment, widths of the second grooves g2 may be greater than widths of the first grooves g1. Further, a depth of each of the second grooves g2 may be greater than a thickness of the package substrate 110. Accordingly, bottom surfaces of the second grooves g2 may be located in the encapsulant 130. The unit semiconductor packages separated by performing the above-described process may have the same structure as a semiconductor package 100a illustrated in FIG. 1A.

Figure 13:
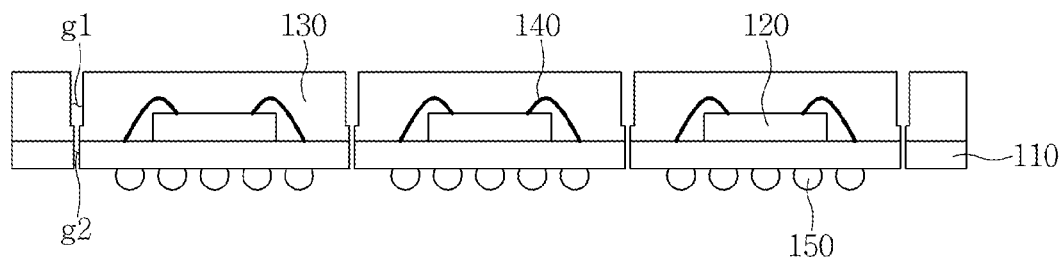

Referring to FIG. 13, second grooves g2 which have widths smaller than the first grooves g1 when compared to FIG. 12 may be formed. The unit semiconductor packages separated by performing the above-described process may have the same structure as a semiconductor package 100d illustrated in FIG. 1D.

Figure 14:
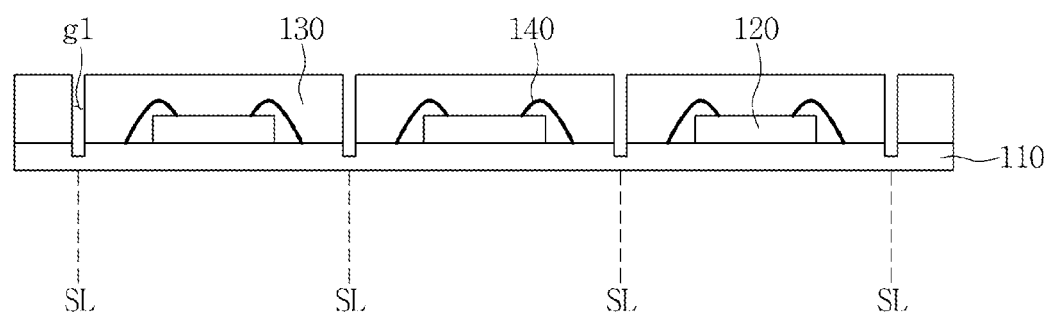
Figure 15:
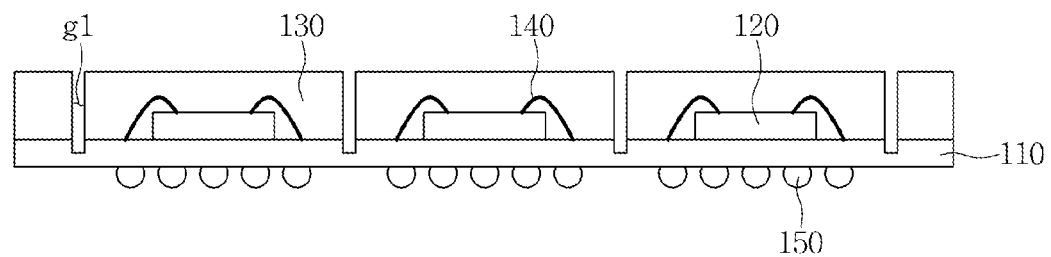
Figure 16:
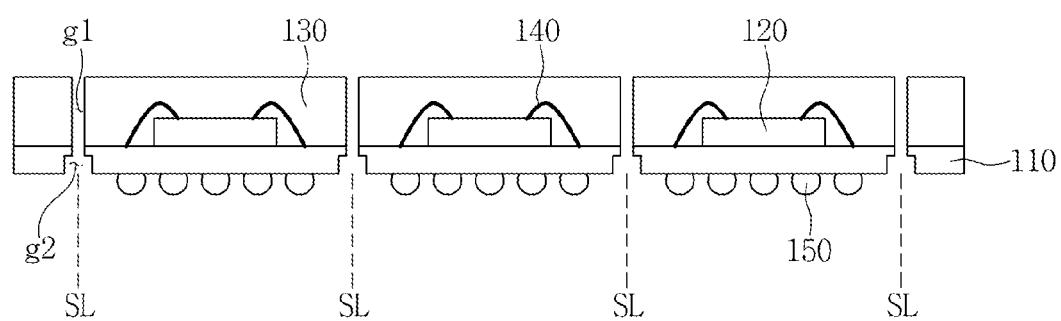

FIGS. 14 to 16 are views illustrating a method of fabricating a semiconductor package according to an embodiment of the present disclosure.

First, referring to FIGS. 2 to 4, the method of fabricating the semiconductor package according to the embodiment of the present disclosure may include disposing the plurality of semiconductor chips 120 on the package substrate 110, bonding the semiconductor chips 120 to the package substrate 110 using wires 140, forming the encapsulant 130 to cover the upper and side surfaces of the semiconductor chips 120 and the wires 140 on the package substrate 110, and forming the package assembly by performing the first curing of the encapsulant 130.

Referring to FIG. 14, the method may include cutting a half of the package assembly. Specifically, the method may include forming first grooves g1 by cutting the encapsulant 130 and a part of the package substrate 110 along sawing lines SL, and performing a second curing of the encapsulant 130 in which the first grooves g1 are formed. At this moment, a depth of each of the first grooves g1 may be greater than a thickness of the encapsulant 130. Accordingly, bottom surfaces of the first grooves g1 may be located inside of the package substrate 110.

Referring to FIG. 15, the method may include forming external connection terminals 150 under a lower surface of the package substrate 110. Since the formation of the external connection terminals 150 under the lower surface of the package substrate 110 has been described above, further descriptions will be omitted here.

Referring to FIG. 16, the method may include dividing the package assembly into unit semiconductor packages. Specifically, the method may include forming second grooves g2 to overlap the first grooves g1 by cutting the package substrate 110 along the sawing lines SL. At this moment, widths of the second grooves g2 may be greater than widths of the first grooves g1. Further, a depth of each of the second grooves g2 may be smaller than a thickness of the package substrate 110. Accordingly, bottom surfaces of the second grooves g2 may be located in the package substrate 110. The unit semiconductor packages separated by performing the above-described process may have the same structure as a semiconductor package 100e illustrated in FIG. 1E.

Figure 17:
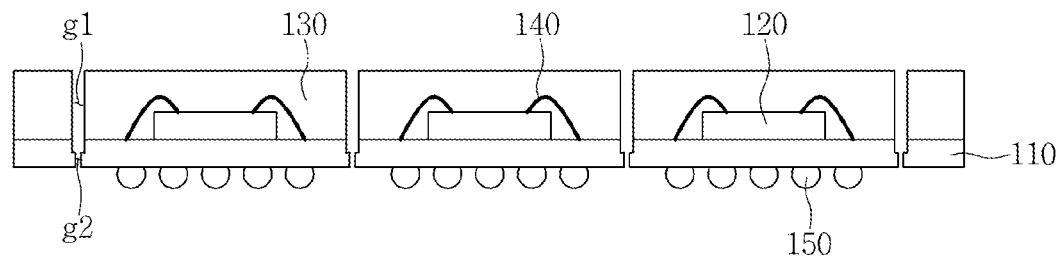

Referring to FIG. 17, second grooves g2 which have widths smaller than the first grooves g1 when compared to FIG. 16 may be formed. The unit semiconductor packages separated by performing the above-described process may have the same structure as a semiconductor package 100f illustrated in FIG. 1F.

Figure 18:
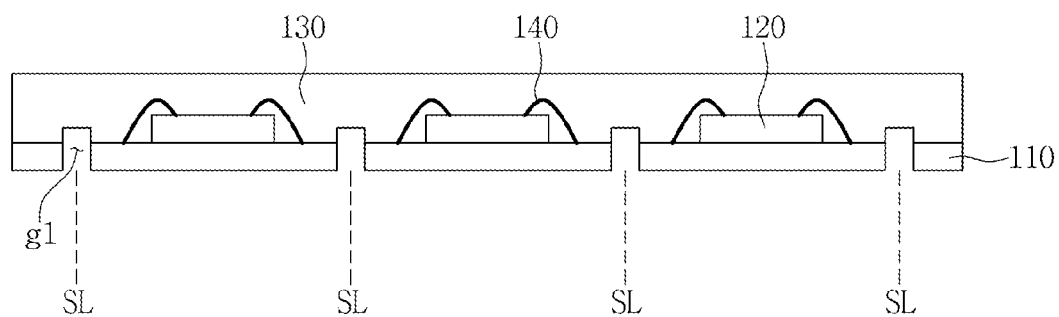
Figure 19:
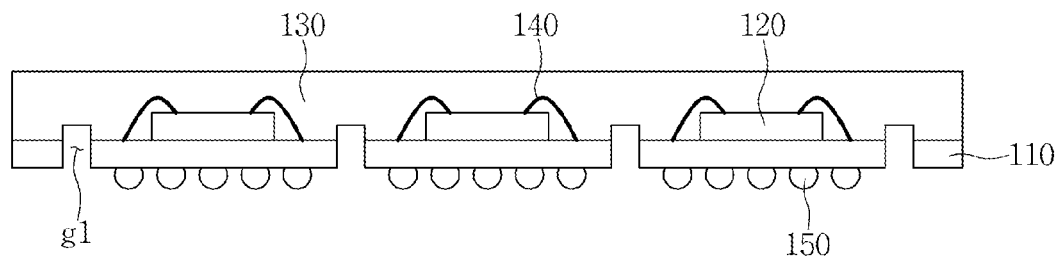
Figure 20:
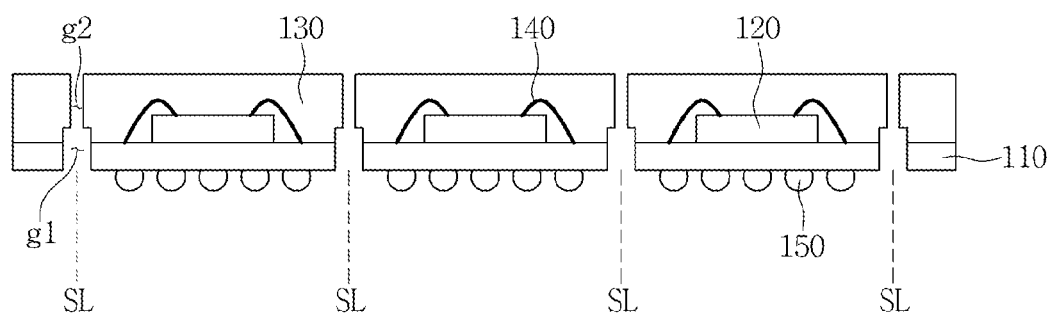

FIGS. 18 to 20 are views illustrating a method of fabricating a semiconductor package according to an embodiment of the present disclosure.

First, referring to FIGS. 2 to 4, the method of fabricating the semiconductor package according to the embodiment of the present disclosure may include disposing the plurality of semiconductor chips 120 on the package substrate 110, bonding the semiconductor chips 120 to the package substrate 110 using wires 140, forming the encapsulant 130 to cover the upper and side surfaces of the semiconductor chips 120 and the wires 140 on the package substrate 110, and forming the package assembly by performing the first curing of the encapsulant 130.

Referring to FIG. 18, the method may include cutting a half of the package assembly. Specifically, the method may include forming first grooves g1 by cutting the package substrate 110 and a part of the encapsulant 130 along sawing lines SL, and performing a second curing of the encapsulant 130 in which the first grooves g1 are formed. At this moment, a depth of each of the first grooves g1 may be greater than a thickness of the package substrate 110. Accordingly, bottom surfaces of the first grooves g1 may be located in the encapsulant 130.

Referring to FIG. 19, the method may include forming external connection terminals 150 under a lower surface of the package substrate 110. Since the formation of the external connection terminals 150 under the lower surface of the package substrate 110 has been described above, further descriptions will be omitted here.

Referring to FIG. 20, the method may include dividing the package assembly into unit semiconductor packages. Specifically, the method may include forming second grooves g2 to overlap the first grooves g1 by cutting the encapsulant 130 along the sawing lines SL. At this moment, widths of the second grooves g2 may be smaller than widths of the first grooves g1. The unit semiconductor packages separated by performing the above-described process may have the same structure as a semiconductor package 100a illustrated in FIG. 1A.

FIGS. 21 to 25 are views illustrating a method of fabricating a semiconductor package according to an embodiment of the present disclosure.

Figure 21:
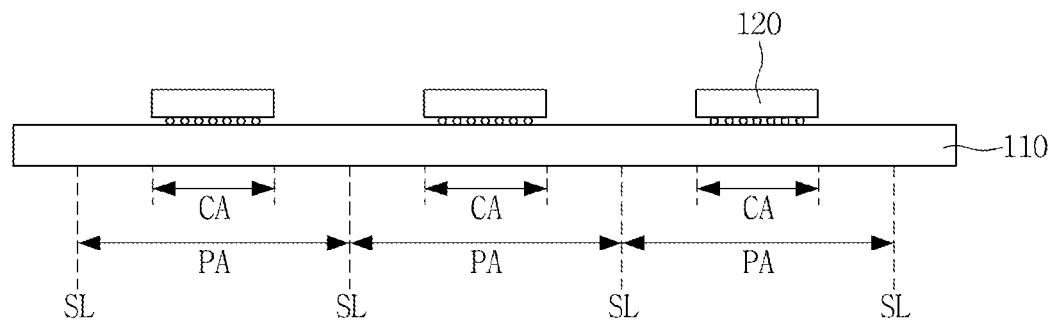

Referring to FIG. 21, the method of fabricating the semiconductor package according to the embodiment of the present disclosure may include disposing a plurality of semiconductor chips 120 on a package substrate 110. Disposing the plurality of semiconductor chips 120 on the package substrate 110 may include bonding the semiconductor chips 120 on the package substrate 110 through flip chip bonding.

Figure 22:
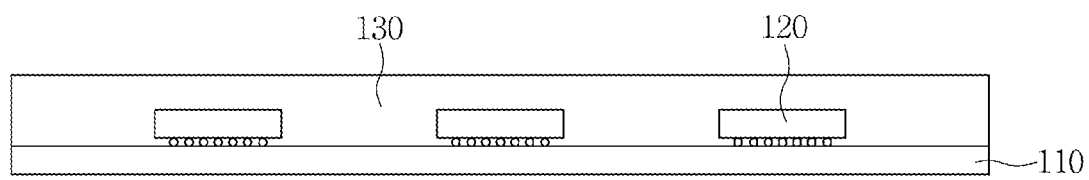

Referring to FIG. 22, the method may include forming an encapsulant 130 in an uncured state (i.e., an a-stage) to cover upper surfaces and side surfaces of the semiconductor chips 120 on the package substrate 110, and forming a package assembly by performing a first curing of the formed encapsulant 130. The first curing may be performed at a temperature of 160° C. to 180° C. for 60 seconds. After the first curing, the encapsulant 130 may be semi-cured state (i.e., a b-stage).

Figure 23:
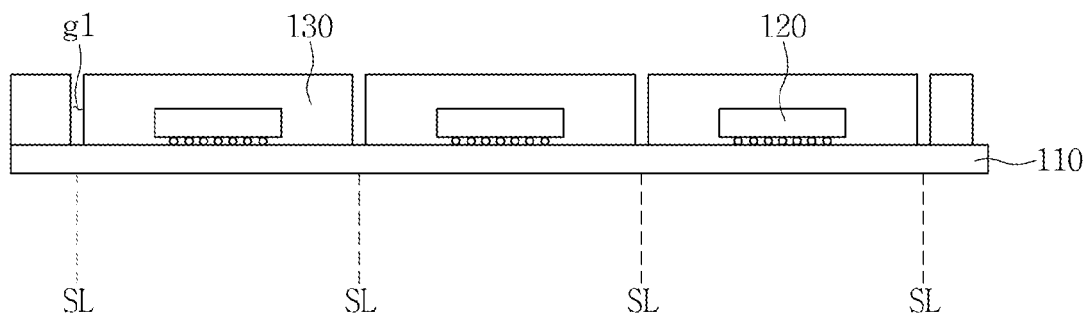

Referring to FIG. 23, the method may include cutting a half of the package assembly, and may include performing a second curing of the encapsulant 130. Specifically, the method may include forming first grooves g1 by cutting the encapsulant 130 along sawing lines SL, and may include performing a second curing of the encapsulant 130 having the first grooves g1 formed at a temperature of 170° C. to 180° C. for 2 hours. After the second curing, the encapsulant 130 may be fully cured state (i.e., a c-stage).

Here, the cutting of the encapsulant 130 may be performed using a laser. A depth of each of the first grooves g1 and a thickness of the encapsulant 130 may be substantially the same. Accordingly, an upper surface of the package substrate 110 may be exposed in the first grooves g1.

Figure 24:
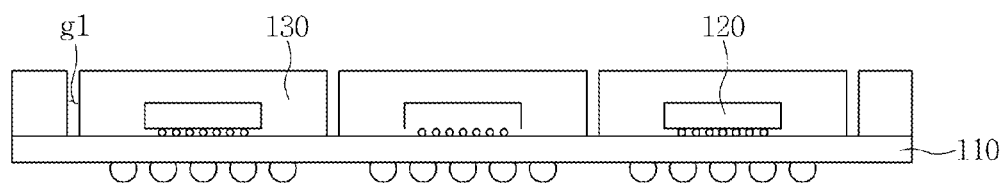

Referring to FIG. 24, the method may include forming external connection terminals 150 under a lower surface of the package substrate 110. The external connection terminals 150 may include solder balls.

Figure 25:
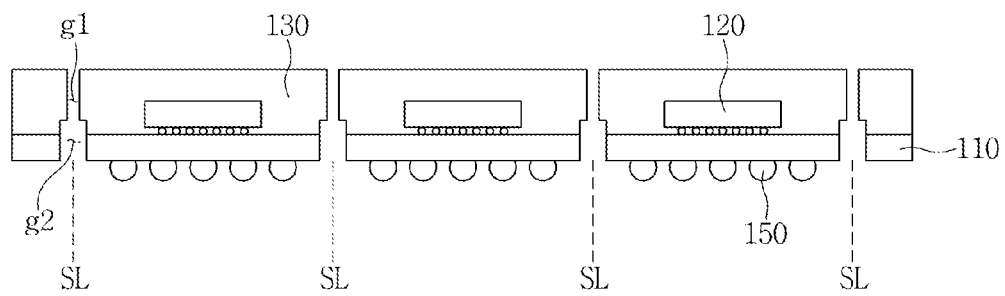

Referring to FIG. 25, the method may include dividing the package assembly into unit semiconductor packages. Specifically, the method may include cutting the package substrate 110 along sawing lines SL and forming second grooves g2 to overlap the first grooves g1.

Here, the cutting of the package substrate 110 may be performed using a blade. Widths of the second grooves g2 may be different from widths of the first grooves g1. For example, the widths of the second grooves g2 may be greater than the widths of the first grooves g1. A depth of each of the second grooves g2 may be greater than a thickness of the package substrate 110. Accordingly, bottom surfaces of the second grooves g2 may be located in the encapsulant 130. The unit semiconductor packages separated by performing the above-described process may have the same structure as a semiconductor package 100g illustrated in FIG. 1G.

Figure 26:
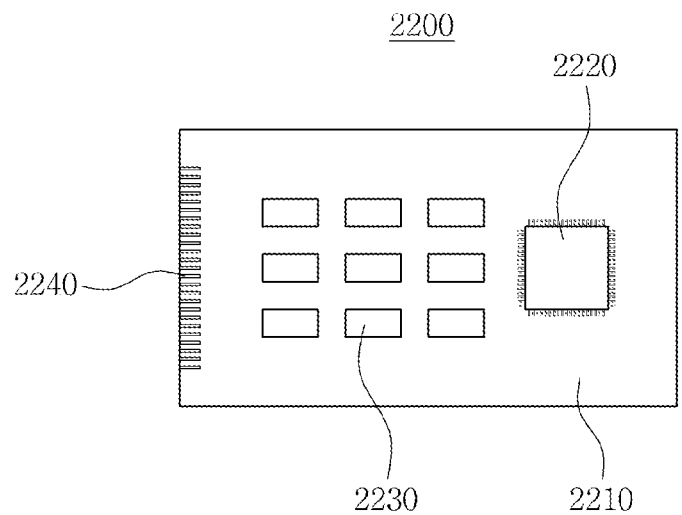
FIGS. 26 to 29 are views conceptually illustrating a module, electronic systems and a mobile wireless phone applying semiconductor packages according to various embodiments of the present disclosure.

According to an embodiment of the present disclosure, FIG. 26 is a view conceptually illustrating a module including the semiconductor packages according to various embodiments of the present disclosure. Referring to FIG. 26, a module 2200 according to the embodiment of the present disclosure may include a semiconductor device 2230 on a module substrate 2210, and the semiconductor device 2230 may include semiconductor package structures according to various embodiments of the present disclosure. The module 2200 may further include a microprocessor 2220 mounted on the module substrate 2210. I/O terminals 2240 may be disposed on at least one side of the module substrate 2210.

The semiconductor device 2230 may be mounted on the module substrate 2210 using a flip chip technique.

Figure 27:
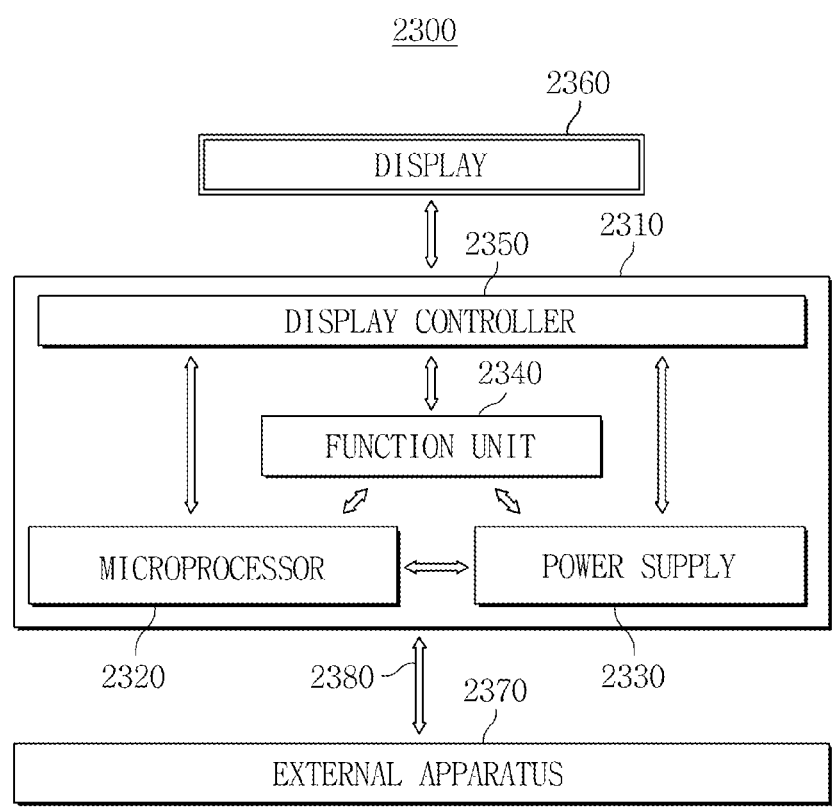

FIG. 27 is a system block diagram describing an electronic device according to an application embodiment of the present disclosure.

Referring to FIG. 27, the semiconductor package according to various embodiments of the present disclosure may apply to an electronic system 2300. The electronic system 2300 may include a body 2310, a microprocessor 2320, a power supply 2330, a function unit 2340, and a display controller 2350. The body 2310 may include a motherboard formed with a PCB. The microprocessor 2320, the power supply 2330, the function unit 2340, and the display controller 2350 may be mounted on the body 2310. A display 2360 may be disposed inside the body 2310 or outside the body 2310. For example, the display 2360 may be disposed on a surface of the body 2310 and display an image processed by the display controller 2350.

The power supply 2330 may receive a constant voltage from an external battery (not shown), may divide the voltage into required voltage levels, and may serve to supply the voltages to the microprocessor 2320, the function unit 2340 and the display controller 2350. The microprocessor 2320 may receive a voltage from the power supply 2330 and may control the function unit 2340 and the display unit 2360. The function unit 2340 may perform various functions of the electronic system 2300. For example, when the electronic system 2300 is a mobile phone, the function unit 2340 may include a dialing or various components of mobile functions such as an image output to the display unit 2360 or an audio output to a speaker from an external apparatus 2370. The function unit 2340 may further serve as a camera image processor when a camera is mounted.

According to an application embodiment, when the electronic system 2300 includes a memory card or the like to expand a storage capacity, the function unit 2340 may serve as a memory card controller. The function unit 2340 may exchange a signal with the external apparatus 2370 via either a wired or wireless communication unit 2380. Furthermore, when the electronic system 2300 uses a Universal Serial Bus (USB) or the like to expand functions, the function unit 2340 may serve as an interface controller. In addition, the function unit 2340 may include a mass capacity storage device. The semiconductor package according to various embodiments of the present disclosure may be applied to the function unit 2340 or the microprocessor 2320.

Figure 28:
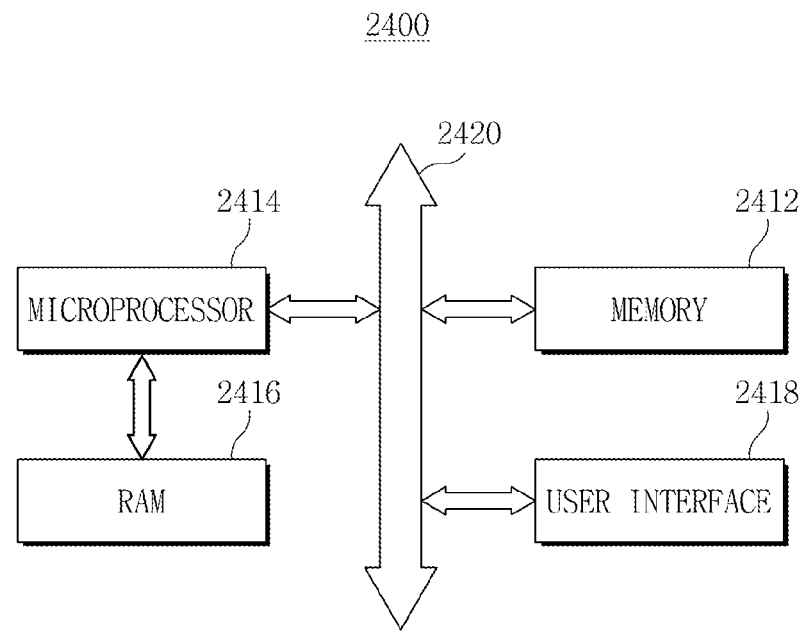

FIG. 28 is a block diagram schematically illustrating another electronic system 2400 including at least one of the semiconductor packages according to various embodiments of the present disclosure.

Referring to FIG. 28, the electronic system 2400 may include at least one of the semiconductor package stack structures according to various embodiments of the present disclosure. The electronic system 2400 may be used for manufacturing a mobile device or a computer. For example, the electronic system 2400 may include a memory 2412, a microprocessor 2414, a RAM 2416, and a user interface 2418. The microprocessor 2414 may program and control the electronic system 2400. The RAM 2416 may be used as an operational memory of the microprocessor 2414. The microprocessor 2414, the RAM 2416 and/or other components may be assembled in a single package. The memory 2412 may store operational codes of the microprocessor 2414, data processed by the microprocessor 2414, or external input data. The memory 2412 may include a controller and a memory. The semiconductor package according to various embodiments of the present disclosure may be applied to the microprocessor 2414, the RAM 2416, or the memory 2412.

Figure 29:
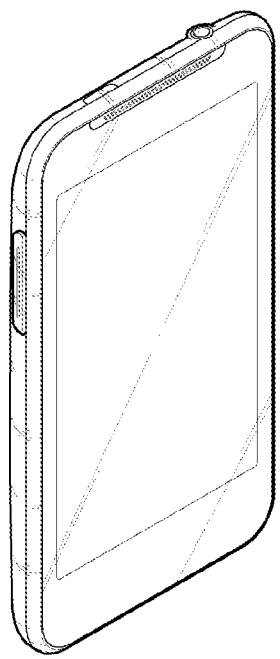

FIG. 29 is a view schematically illustrating a mobile wireless phone 2500 including at least one of the semiconductor packages according to various embodiments of the present disclosure. The mobile wireless phone 2500 may be understood as a tablet PC. In addition, at least one of the semiconductor packages according to various embodiments of the present disclosure may be used in a portable computer such as a notebook, an mpeg-1 audio layer 3 (MP3) player, an MP4 player, a navigation instrument, a solid state drive (SSD), a table computer, an automobile, and a home appliance in addition to the tablet PC.

In addition, elements that are not denoted by reference numbers or denoted only by reference numbers may be easily understood from the name, the functions, and the like of other drawings and the descriptions used herein.

In accordance with embodiments of the present disclosure, a method of fabricating a semiconductor package can provide a package assembly with a reduced or minimized warpage by performing a first curing of an encapsulant followed by cutting a semi-cured encapsulant along sawing lines and disconnecting connections among semiconductor chips, and then by performing a second curing of the semi-cured encapsulant.

Further, a warpage of each of the final separated unit semiconductor packages can be further reduced by reducing or minimizing a warpage of the package assembly.

Other various descriptions have been mentioned in detailed descriptions of embodiments of the present disclosure.

The foregoing is illustrative of embodiments of the present disclosure with reference to the accompanying drawings. Although a number of embodiments have been described, those of ordinary skill in the art will readily understand that many modifications are possible in the embodiments without materially departing from the novel teachings and advantages. Therefore, it is to be understood that the foregoing is illustrative of various embodiments and is not to be construed as limited to the specific embodiments disclosed.

What is claimed is:

1. A method of fabricating a semiconductor package, comprising:
    disposing semiconductor chips on a package substrate having sawing lines;
    forming a package assembly including forming an encapsulant to cover the semiconductor chips on the package substrate;
    performing a first curing of the encapsulant;
    cutting the encapsulant along the sawing lines to form first grooves;
    performing a second curing of the encapsulant;
    cutting the package substrate along the sawing lines to form second grooves after the performing a second curing, the second grooves overlapping the first grooves; and
    dividing the package assembly into unit semiconductor packages.

2. The method of claim 1, wherein the cutting the encapsulant is performed using a laser.

3. The method of claim 1, wherein the cutting the package substrate is performed using a blade.

4. The method of claim 1, wherein a width of each of the first grooves is smaller than a width of each of the second grooves.

5. The method of claim 4, wherein the first grooves are formed to have depths substantially the same as a thickness of the encapsulant.

6. The method of claim 4, wherein the second grooves are formed to have depths greater than a thickness of the package substrate.

7. The method of claim 1, wherein a width of each of the first grooves is greater than a width of each of the second grooves.

8. The method of claim 1, wherein the first grooves are formed to have depths smaller than a thickness of the encapsulant.

9. The method of claim 1, wherein the first grooves are formed to have depths greater than a thickness of the encapsulant.

10. The method of claim 1, wherein the first curing is performed at a temperature of 160° C. to 180° C. for 60 seconds.

11. The method of claim 1, wherein the second curing is performed at a temperature of 170° C. to 180° C. for 2 hours.

12. The method of claim 1, further comprising:
forming external connection terminals under a lower surface of the package substrate after performing the second curing of the encapsulant.

13. A method of fabricating a semiconductor package, comprising:
disposing semiconductor chips on a package substrate having sawing lines;
bonding the semiconductor chips to the package substrate;
forming a package assembly including forming an encapsulant to cover upper and side surfaces of the semiconductor chips on the package substrate;
performing a first curing of the encapsulant;
cutting the package substrate along the sawing lines to form first grooves;
performing a second curing of the encapsulant;
forming external connection terminals under a lower surface of the package substrate;
cutting the encapsulant along the sawing lines; to form second grooves after the performing a second curing, the second grooves overlapping the first grooves; and
dividing the package assembly into unit semiconductor packages.

14. The method of claim 13, wherein the forming the external connection terminals includes:
flipping the package assembly to have the lower surface of the package substrate facing upward;
mounting solder balls on the lower surface of the package substrate; and
attaching the mounted solder balls to the lower surface of the package substrate through a reflow process.

15. The method of claim 13, wherein the bonding the semiconductor chips on the package substrate is performed either through flip chip bonding or through wires.

16. A method of fabricating a semiconductor package, comprising:
disposing semiconductor chips on a package substrate;
forming a package assembly including forming an encapsulant to cover the semiconductor chips on the package substrate;
performing a first curing of the encapsulant;
cutting a half of the package assembly;
performing a second curing of the encapsulant; and
dividing the package assembly into unit semiconductor packages after the performing a second curing.

17. The method of claim 16, wherein the cutting the half of the package assembly comprises cutting the encapsulant using a laser.

18. The method of claim 17, wherein the dividing the package assembly into the unit semiconductor packages comprises cutting the package substrate using a blade.

19. The method of claim 18, wherein the cutting the encapsulant is performed by a width smaller than a width by which the package substrate is cut.

20. The method of claim 16, further comprising:
forming external connection terminals under a lower surface of the package substrate after performing the second curing of the encapsulant.

* * * * *